United States Patent
Morris

(10) Patent No.: US 9,869,722 B1
(45) Date of Patent: Jan. 16, 2018

(54) METHOD AND APPARATUS FOR ELECTRICAL COMPONENT LIFE ESTIMATION

(71) Applicant: Rockwell Automation Technologies, Inc., Mayfield Heights, OH (US)

(72) Inventor: Garron K. Morris, Whitefish Bay, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/293,655

(22) Filed: Oct. 14, 2016

Related U.S. Application Data

(60) Provisional application No. 62/398,248, filed on Sep. 22, 2016.

(51) Int. Cl.
*G01R 31/02* (2006.01)
*G01R 31/34* (2006.01)
*G01R 31/27* (2006.01)
*G01R 31/26* (2014.01)
*G01R 31/36* (2006.01)

(52) U.S. Cl.
CPC ....... *G01R 31/343* (2013.01); *G01R 31/2619* (2013.01); *G01R 31/27* (2013.01); *G01R 31/3675* (2013.01)

(58) Field of Classification Search
CPC .. G01R 31/343; G01R 31/2619; G01R 31/27; G01R 31/3675
See application file for complete search history.

(56) References Cited

U.S. PATENT DOCUMENTS

| | | | |
|---|---|---|---|
| 9,092,030 B2 | 7/2015 | Weiss et al. | |
| 2007/0150236 A1* | 6/2007 | Warizaya | G06F 11/008 702/184 |
| 2009/0063057 A1* | 3/2009 | Miettinen | H05K 7/20945 702/34 |
| 2013/0260664 A1 | 10/2013 | Morris et al. | |
| 2013/0331962 A1 | 12/2013 | Morris | |
| 2013/0331963 A1 | 12/2013 | Ahangar et al. | |
| 2014/0247560 A1 | 9/2014 | Lemberg et al. | |
| 2014/0265976 A1 | 9/2014 | Weiss et al. | |

OTHER PUBLICATIONS

Peter Andrew James, Health Monitoring of IGBTs in Automotive Power Converter Systems, Dissertation, The University of Manchester School of Electrical and Electronic Engineering, 2012.*

* cited by examiner

*Primary Examiner* — Daniel Miller
(74) *Attorney, Agent, or Firm* — Fay Sharpe LLP

(57) ABSTRACT

Systems and methods for estimating electrical component degradation caused by an operating parameter that stresses the component in a series of stress cycles, in which cycle count values are maintained which individually correspond to a range of values of the operating parameter, and a plurality of maximum cycle values are stored, which individually correspond to one of the ranges and represent the number of stress cycles in the corresponding range at which the component is expected to have a user defined failure probability value. For a given stress cycle, one of the count values is incremented that corresponds to the range that includes a measured or sensed value, and a cumulative degradation value for the electrical system component is computed as a sum of ratios of the individual count values to the corresponding maximum cycle values.

20 Claims, 5 Drawing Sheets

| Risk Factor (X) | 5% | ~400 |
|---|---|---|
| Operating Range | Normal | ~401 |
| Warning Level | 80% | ~402 |
| Alarm Level | 95% | ~403 |

182

| TjMax | 150 |
|---|---|
| A | 10.5676 |
| B | 6.384 |
| C | 74.305 |
| D | -1.379 |

410

| ΔT Range | | Cycles | Max Cycles | Degradation |
|---|---|---|---|---|
| Min | Max | n | N | n/N |
| 0 | 10 | 183653 | 10552691712 | 1.74034E-05 |
| 10 | 20 | 123106 | 236946029 | 0.000519554 |
| 20 | 30 | 82521 | 12113459 | 0.0068123 |
| 30 | 40 | 55315 | 1885013 | 0.029344706 |
| 40 | 50 | 37079 | 567306 | 0.065359574 |
| 50 | 60 | 24855 | 250594 | 0.099183341 |
| 60 | 70 | 16661 | 139932 | 0.119061949 |
| 70 | 80 | 11168 | 90857 | 0.122917211 |
| 80 | 90 | 7486 | 65298 | 0.114644375 |
| 90 | 100 | 5018 | 50385 | 0.099595046 |
| 100 | 110 | 3364 | 40925 | 0.082191554 |
| 120 | 130 | 1511 | 29997 | 0.050386356 |
| | | | Cumulative Degradation | 79.00% |

420 — rows; 421, 422, 423, 424 — column labels; 425, 426

FIG. 4

| Risk Factor (X) | 5% | ~400 |
|---|---|---|
| Operating Range | Normal | ~401 |
| Warning Level | 80% | ~402 |
| Alarm Level | 95% | ~403 |

182

| TjMax | 150 |
|---|---|
| A | 10.5676 |
| B | 6.384 |
| C | 74.305 |
| D | -1.379 |

410

| ΔT Range | | Cycles | Max Cycles | Degradation |
|---|---|---|---|---|
| Min | Max | n | N | n/N |
| 0 | 10 | 192952 | 10552691712 | 1.82846E-05 |
| 10 | 20 | 129339 | 236946029 | 0.00054586 |
| 20 | 30 | 86699 | 12113459 | 0.007157226 |
| 30 | 40 | 58116 | 1885013 | 0.030830514 |
| 40 | 50 | 38956 | 567306 | 0.06866892 |
| 50 | 60 | 26113 | 250594 | 0.104205283 |
| 60 | 70 | 17504 | 139932 | 0.125090402 |
| 70 | 80 | 11733 | 90857 | 0.129140867 |
| 80 | 90 | 7865 | 65298 | 0.120449153 |
| 90 | 100 | 5272 | 50385 | 0.104637833 |
| 100 | 110 | 3534 | 40925 | 0.086353152 |
| 120 | 130 | 1588 | 29997 | 0.052937563 |
| | | | Cumulative Degradation | 83.00% |

FIG. 5

METHOD AND APPARATUS FOR ELECTRICAL COMPONENT LIFE ESTIMATION

REFERENCE TO RELATED APPLICATION

The present application claims priority to, and the benefit of, U.S. Provisional Application No. 62/398,248, filed Sep. 22, 2016, the subject matter of which is incorporated herein by reference in its entirety.

BACKGROUND INFORMATION

The subject matter disclosed herein relates to electrical component degradation estimation.

BRIEF DESCRIPTION

Disclosed examples include systems and methods for estimating electrical component degradation, which can be used for prognostic evaluation in a motor drive or other electrical system. Component degradation caused by temperature, voltage, rotational speed or other operating parameter that stresses the component in a series of stress cycles is evaluated in certain examples by maintaining cycle count values which individually correspond to a range of values of the operating parameter as well as maximum cycle values which individually correspond to one of the ranges and represent the number of stress cycles in the corresponding range at which the component is expected to have a user defined failure probability value. For a given stress cycle, one of the count values is incremented that corresponds to the range that includes a measured or sensed value, and a cumulative degradation value for the electrical system component is computed as a sum of ratios of the individual count values to the corresponding maximum cycle values.

BRIEF DESCRIPTION OF THE DRAWINGS

FIG. 4 is a schematic diagram.
FIG. 5 is a schematic diagram.

DETAILED DESCRIPTION

Figure 1:
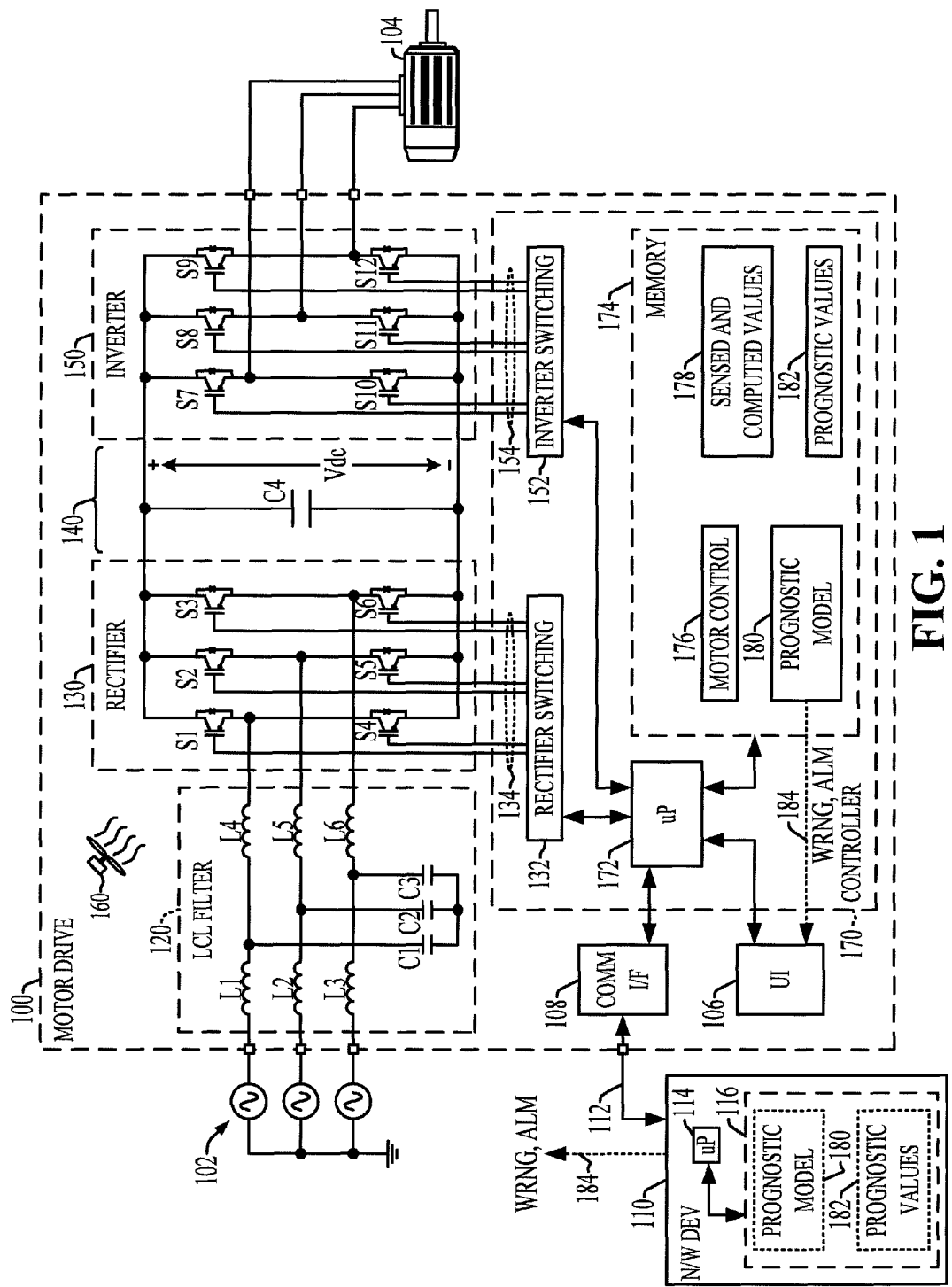
FIG. 1 is a schematic diagram.

FIG. 1 illustrates an example electrical system to convert electrical power to drive a load. The example system includes a motor drive power conversion system 100 receiving single or multiphase AC input power from an external power source 102. The illustrated example receives a three-phase input. In other examples, single phase or other multiphase embodiments are possible. The motor drive 100 converts input power from the source 102 to deliver output power to drive a motor load 104. The motor drive 100 includes a three phase LCL input filter circuit 120 having grid side inductors L1, L2 and L3 connected to the power leads of the power source 102, series connected converter side inductors L4, L5 and L6, and filter capacitors C1, C2 and C3 connected between the corresponding grid and converter side inductors and a common connection node, which may but need not be connected to a system ground. The motor drive 100 also includes a rectifier 130, a DC bus or DC link circuit 140, an output inverter 150 and a fan 160 to circulate air within a drive enclosure (not shown) for cooling one or more system electrical components.

The rectifier 130 and the inverter 150 are operated by a controller 170. The controller 170 includes a processor 172, an electronic memory 174 that stores data and program instructions, as well as a rectifier controller 132 and an inverter controller 152. The controller 170 and the components thereof may be implemented as any suitable hardware, processor-executed software, processor-executed firmware, logic, and/or combinations thereof wherein the illustrated controller 170 can be implemented largely in processor-executed software or firmware providing various control functions by which the controller 170 receives feedback and/or input signals and/or values (e.g., setpoint(s)) and provides rectifier and inverter switching control signals 134 and 154 to operate switching devices S1-S6 of the rectifier 130 and switches S7-S12 of the inverter 150 to convert input power for providing AC output power to drive the load 104. In addition, the controller 170 and the components 132, 152 thereof can be implemented in a single processor-based device, such as a microprocessor, microcontroller, FPGA, etc., or one or more of these can be separately implemented in unitary or distributed fashion by two or more processor devices.

The motor drive 100 in one example provides an active front end (APE) including a switching rectifier (also referred to as a converter) 130 receiving three-phase power from the source 102 through the filter circuit 120. The active rectifier 130 includes rectifier switches S1-S6, which may be insulated gate bipolar transistors (IGBTs) or other suitable form of semiconductor-based switching devices operable according to a corresponding rectifier switching control signal 134 to selectively conduct current when actuated. In addition, diodes are connected across the individual IGBTs S1-S6. In operation, switching of the rectifier switches S1-S6 is controlled according to pulse width modulated rectifier switching control signals 134 from the rectifier switching controller 132 to provide active rectification of the AC input power from the source 102 to provide a DC bus voltage Vdc across a DC bus capacitor C4 in the DC link circuit 140. The inverter 150 includes switches S7-S12 coupled to receive power from the DC bus 140 and to provide AC output power to a motor or other load 104. The inverter switches S7-S12 can be any form of suitable high-speed switching devices, including without limitation IGBTs that operate according to switching control signals 154 from the inverter switching control component 152 of the drive controller 170.

In certain examples, the controller 170 receives various input signals or values, including setpoint signals or values for desired output operation, such as motor speed, position, torque, etc., as well as feedback signals or values representing operational values of various portions of the motor drive 100 and electrical system components of the drive 100. For example, the drive 100 includes various sensors (not shown) to provide sensor signals to the controller 172 indicate operating conditions of one or more components in the drive system 100, including thermocouples, RTDs or other temperature sensors to provide signals or values to the controller 170 indicating the temperatures of the switches S1-S12, the filter and DC bus capacitors C1-C4, ambient temperature(s) associated with the interior of the motor drive enclosure, voltages associated with one or more components (e.g., voltages associated with the switches S1-S12, voltages across the capacitors C1-C4), operating speed (rpm) of the fan 160, etc. In addition, the controller 170 in certain examples receives one or more voltage and/or current feedback signals or values from sensors to indicate the DC bus voltage Vdc, line to line AC input voltage values, motor line to line voltage values and/or currents, etc.

The controller 170 in one example receives and stores this information as sensed and computed values 178 in the memory 174. The stored values 178 can include values computed by the processor 172 based on one or more sensor signals or values, such as temperature change values (e.g., ΔT) representing the temperature of a component relative to the ambient temperature of the drive enclosure. The sensed and computed values 178 in one example are obtained or updated periodically by the processor 172, and the controller 170 includes suitable sensor interface and/or communications circuitry to receive sensor signals and/or digital values from sensors in the drive system 100. In certain implementations, the processor 172 uses certain of this information 178 to perform closed loop control of the operation of the motor load 104 by execution of motor control program instructions 176 stored in the memory 174, such as speed control, torque control, etc.

In addition, the controller 170 in certain examples implements prognostic functions by executing program instructions 182 estimate degradation of one or more electrical system components of the motor drive 100. In addition, the memory 174 stores one or more prognostic values 182. The processor 172 in one example implements the prognostic model program instructions 182 estimate electrical component degradation and selectively generate one or more alarm and/or warning signals or messages 184 to identify degradation of one or more electrical components to a user. As shown in the example of FIG. 1, the processor 172 is operatively coupled with a user interface (UI) 106, such as a touchscreen or other user interface associated with the motor drive system 100. In certain examples, the control processor 172 provides one or more warnings and/or alarms 184 to the user interface 106 to alert the user to certain threshold conditions associated with one or more electrical components in the drive 100.

In certain examples, moreover, the control processor 172 is operatively coupled with one or more network devices 110 via a communications interface 108 and a network connection 112, which can be wired, wireless, optical or combinations thereof. In certain examples, the controller 170 provides one or more of the sensed and/or computed values 178 to the network device 110 via the communications interface 108 and the network 112, and the network device 110 includes a processor 114 and a memory 116 to implement the prognostic model program instructions 180 and to store the prognostic values 182. In practice, any suitable processor can implement the degradation estimation concepts disclosed herein, whether an on-board processor 172 of the motor drive controller 174 the processor 114 of the network device 110. In certain examples, the network device 110 can be a network server implementing the prognostic model 180 as program instructions for execution by the server processor 114. In another example, the network device 110 can be a process control device, such as a control module in a distributed control system (DCS), and the communications interface 108 and the network 112 can be a network of a DCS for exchanging values and messages (e.g., sensed and/or computed values 178) between the motor drive 100 and the control module 110.

Figure 2:
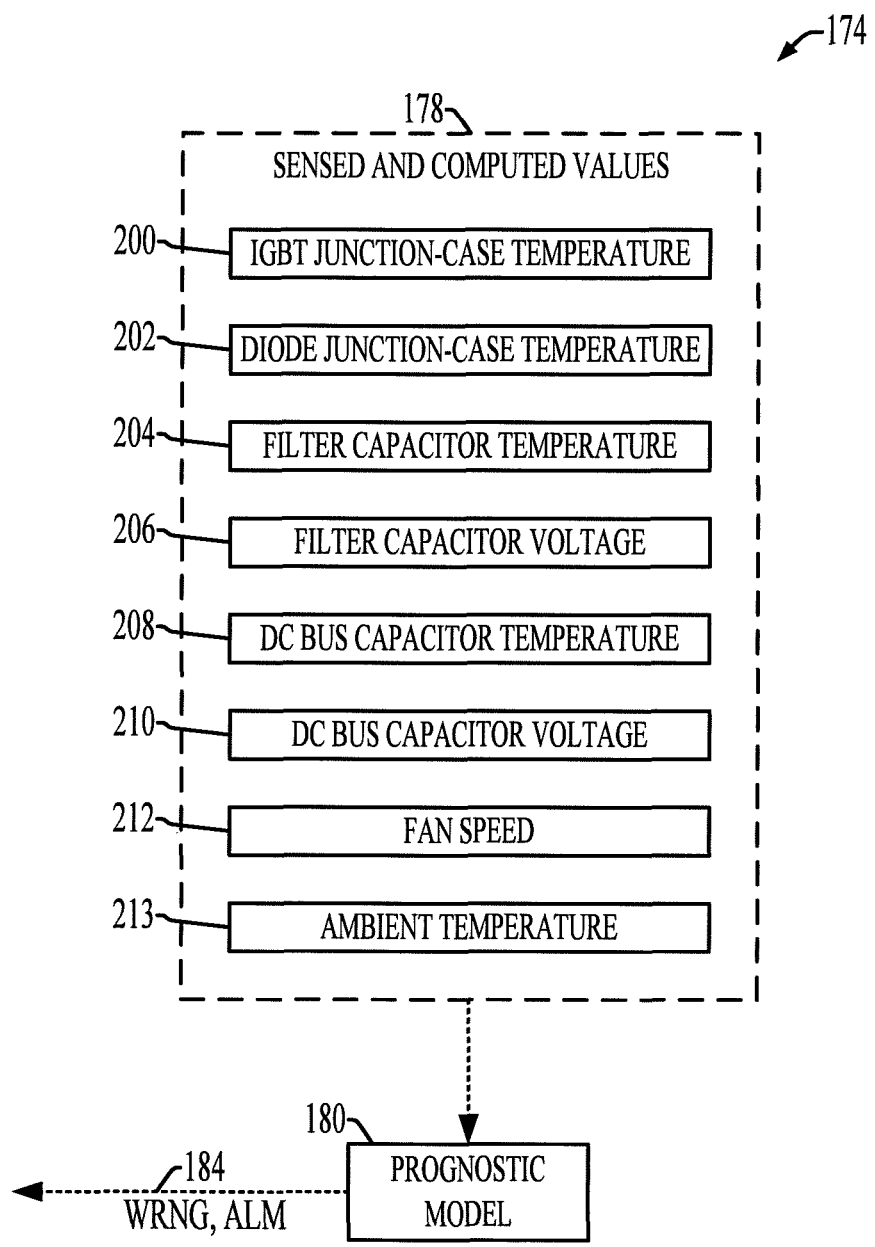
FIG. 2 is a schematic diagram.

Referring also to FIG. 2, the processor implemented prognostic model 180 operates on one or more sensed and/or computed values 178 stored in the memory 174. The operation of the prognostic model 180 is described hereinafter in the context of implementation by the control processor 172 via the electronic memory 174 in the drive controller 170. It will be appreciated that implementation in a network device 110 or other processor-based system will operate in similar fashion. As illustrated in FIG. 2, the sensed and computed values 178 can be stored for one or more components of the electrical drive system 100 in one example. For example, the values 178 can be saved for the individual rectifier and/or inverter switches S1-S12, the drive capacitor C1-C4 and/or the drive cooling fan 160 in the example of FIGS. 1 and 2. In one example an IGBT junction-case temperature value 200 is stored in the memory 174 for each of the switches S1-S12. The value(s) may be computed, for example, with the IGBT junction-case temperature 200 being computed from the heat generation in the IGBT and a sensor value from a thermocouple or RTD individually associated with a given one of the switches S1-S12. As shown in FIG. 2, the sensed and computed values 178 may further include one or more diode junction-case temperatures 202, filter capacitor temperatures 204, filter capacitor voltages 206, DC bus capacitor temperatures 208, DC bus capacitor voltages 210, fan speed value 212, and air temperature 213.

Figure 3:
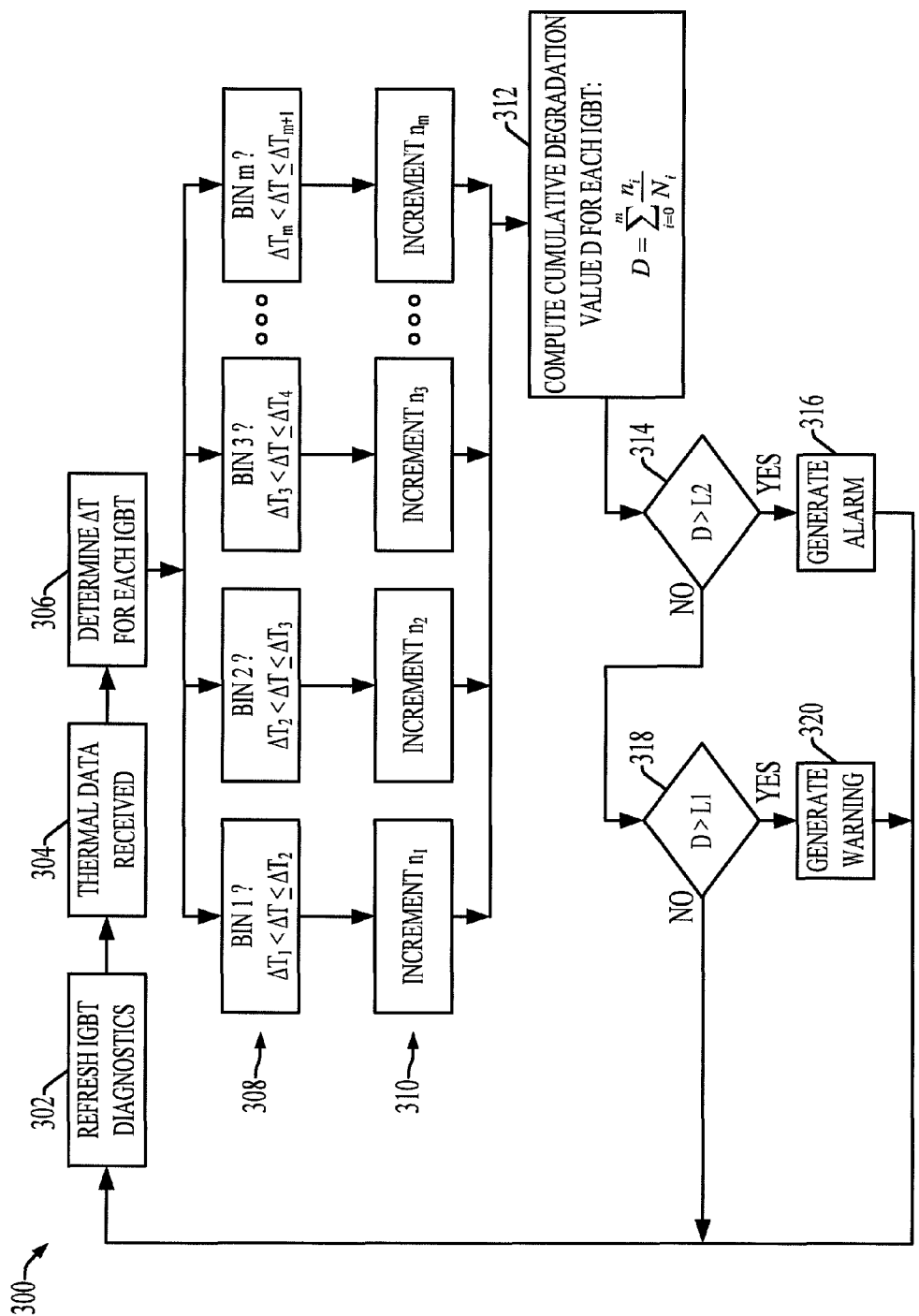
FIG. 3 is a flow diagram.

Referring also to FIGS. 3-5, FIG. 3 shows a process or method 300 for estimating degradation of an electrical system component caused by an operating parameter that stresses the electrical system component for each of a series of stress cycles. The method 300 in one example is implemented by the processor 172 using one or more of the values 178 to execute the prognostic model program instructions 180 in order to selectively generate one or more warnings and/or alarms 184 based on modeled component degradation. For example, electrical component degradation in the motor drive system example 100 can be modeled by the prognostic model 182 estimate degradation caused by a temperature change operating parameter ΔT (e.g., switch and/or diode degradation), a voltage operating parameter V (e.g., capacitor degradation), speed operating parameter RPM (e.g., fan degradation), and ambient temperature T. In general, the processor 172 and the memory 174 operate according to cycle count values n (423 in FIG. 4) maintained as part of the prognostic values 182 in the memory 174 which individually correspond to a range 420 of values (e.g., referred to herein as "bins") of the operating parameter ΔT, V, RPM, and T. In addition, the processor 172 and the memory 174 operate according to a corresponding plurality of maximum cycle values N (424) which individually correspond to one of the ranges 420 and represent the number of stress cycles in the corresponding range 420 at which the component S1-S12, C1-C4 or 160 is expected to have a user defined failure probability value 400 (e.g., a user selected 'risk factor').

In operation for a given stress cycle, the processor 172 increments one of the count values n, 423 that corresponds to the range 420 that includes a measured or sensed value 178 four that stress cycle. The processor 172 computes a cumulative degradation value D, 426 for the electrical system component S1-S12, C1-C4, 160 as the sum of ratios of the individual count values n, 423 divided by the corresponding maximum cycle values N, 424. The processor 172 then compares the computed cumulative damage value D with one or more user defined trigger or threshold levels 402, 403 to selectively generate alarms and/or warnings 184, which can be provided to the user interface 106 of FIG. 1 in one example.

The operation of the processor 172 in implementing the method 300 of FIG. 3 is illustrated and described below in the context of degradation estimation for an IGBT switch S1. Similar operation is undertaken in certain examples for the other switches S2-S12, as well as for the corresponding flyback diodes associated with the switches S1-S12. Furthermore, the described processing 300 and operation of the processor 172 in implementing the prognostic model 180 can be used to assess voltage and/or temperature related degradation of other system electrical components (e.g., filter capacitor C1-C3 and/or DC bus capacitor C4) and/or for degradation of the system cooling fan 160 based on speed cycle stresses. In each example, the range of an operating parameter (e.g., temperature, voltage, speed) that stresses the corresponding electrical system component (e.g., switches, diodes, capacitors, fan motors) is segmented into multiple non-overlapping bins or ranges (420 in FIGS. 4 and 5), and the prognostic values 182 include a maximum cycle value N (424) for each of the bins or ranges. The individual maximum cycle value N, 424 for each range represents the number of stress cycles in the corresponding range 420 at which the component is expected to have a user defined failure probability value 400. In one implementation, a user can set the failure probability value or "risk factor" 400 as well as the threshold warning and alarm levels 402 and 403.

Users of electrical systems, such as motor drives 100 can thus be notified when IGBTs or other electrical system components are nearing the end of their useful life, in order to facilitate planned proactive maintenance to avoid or mitigate unplanned system downtime. A user in one example enters values 400-403 (FIG. 4) via the user interface 106 or a network connection, and these values are stored by the processor 172 as part of the prognostic values 182 in the memory 174. In this example, the user defined risk factor 400 represents a user selected failure probability value. An operating range parameter 401 allows the user to select normal or extended temperature range operation for the motor drive 100 (e.g., −20° C. to 40° C. for normal operation, or 40° C. to 55° C. for extended operation). A warning level parameter 402 (e.g., a first level L1) sets a threshold above which the prognostic model 180 will indicate a warning 184 to the user, and an alarm level parameter 403 sets a user defined second level (L2) above which the prognostic model 180 will indicate an alarm 184 to the user via the user interface 106 in one example.

The process 300 in FIG. 3 and the operation of the processor 172 in implementing the prognostic model 180 of the present disclosure advantageously take into account a user's tolerance for risk. The user's risk tolerance for unplanned downtime due to electrical system component failures is accommodated in one example by these three user-defined parameters: warning level, alarm level, and risk factor. The maximum cycle values N, 424 can be obtained from empirical data and/or manufacturer data for a given electrical system component, and the collection of the values 424 represent stress contributions of stress cycle levels over the operating parameter range, and the prognostic model 180 provides a cumulative assessment of the amount of stress imparted on the analyzed electrical component. In one example, the modeling of an IGBT switch S1 is represented by the values 424 based on manufacturer data, testing and/or a mathematical model. This model, as well as the user-specified risk factor 400, are used to create bins of junction-to-case temperature ranges of 5 to 10 degrees wide. In the Examples of FIGS. 4 and 5, 10° C. wide ranges or bins are used over a range from 0° C. to 130° C. representing a reasonable expected operating range for an IGBT switch S1-S12 in the motor drive system 100. Similar models including a reasonable number of two or more bins or operating parameter ranges can be defined for a given electrical component, with the maximum cycle values N for each bin range being predetermined according to manufacturer data, testing and/or a mathematical model. Thus, the described techniques and systems can be used on any type or form of electrical system component, and the present disclosure is not limited to IGBTs or motor drive components.

At 302 in FIG. 3, in one example, every few seconds, the processor 172 updates or refreshes the prognostic values 182 by executing the prognostic model program instructions 180 to determine or estimate an updated cumulative degradation value D 426 for the IGBTs S1-S12 of the example motor drive system 100. In each such stress cycle, the prognostic model 180 can obtain temperature values at 304, for example, from a thermal management component executed by the processor 172 as part of normal drive control functions. At 306, the processor 172 determines a junction to case temperature estimate or temperature difference (e.g., $\Delta T$ or "DT") from the thermal data received at 304, such as by subtracting a measured switch temperature from an ambient temperature inside the motor drive enclosure in one example. Thus, the processor 172 receives a first value 178 at 304, 306 that represents the operating parameter $\Delta T$ for the given stress cycle. For the given stress cycle, The processor 172 then determines at 308 which been or range matches the received first value 178, and increments the corresponding cycle count value n, 423 at 310 that corresponds to the range 420 of values of the operating parameter $\Delta T$ that includes the first value 178. At 312, the processor 172 computes a cumulative degradation value D, 426 for the electrical system component S1 in the given stress cycle as the sum of the ratios of the individual cycle count values n, 423 divided by the corresponding maximum cycle values N, 424 of the plurality 420 of values of the operating parameter $\Delta T$.

The processor 172 makes a determination at 314 as to whether the cumulative degradation value D, 426 for the given stress cycle exceeds a user defined alarm level or threshold value 403 (L2). In the example of FIGS. 4 and 5 below, the user has selected alarm level 403 of L2=95%, with a risk factor 400 of 5%. If so (YES at 314), the processor 172 generates an alarm 184 at 316, and the IGBT diagnostics are again refreshed at 302 in FIG. 3. Otherwise (NO at 314), the processor 172 determines whether the cumulative degradation value D, 426 exceeds the first (warning) threshold level L1 (L1<L2) 402. In the example of FIGS. 4 and 5, the user has selected the warning level 402 of L1=80%. If the cumulative degradation exceeds the first threshold level L1 (YES at 318), the processor 172 generates a warning 184 at 320, and refreshes the IGBT diagnostics at 302. Otherwise, if the cumulative degradation D does not exceed either of the threshold levels 4024403 (NO at 318), the IGBT diagnostics are refreshed at 302, and the processor 172 proceeds with the next stress cycle. In one example, the processor 172 implements similar processing 300 to execute the prognostic model program instructions 180 for each given stress cycle, for each of a number of different system electrical components. For example, the processor can implement the described processing 300 for all of the IGBT switches S1-S12 or a subset thereof, and can implement similar processing to estimate degradation of the associated diodes with respect to case-junction temperature, in which the operating parameter is a junction temperature change $\Delta T$.

Similar processing 300 can be performed with respect to temperature and/or voltage-based stress or degradation of the motor drive capacitor C1-C4 or subsets thereof. In this case, the operating parameter can be a temperature change $\Delta T$ and/or a voltage V. In other examples, the processor 172 implements a prognostic model with respect to degradation of the cooling fan 160, in this case according to motor speed stress cycles and local ambient temperature the motor. In this example, the operating parameter can be a fan speed RPM and ambient temperature. In this regard, different electrical components can be assessed by the processor 172 at different periodic temporally spaced stress cycles, where the temporal length of a stress cycle can be different for different electrical component types.

The disclosed examples allow the IGBT or other component predictive reliability model 180 to adapt to the user needs by considering user defined warning level, alarm level, and amount of risk the user is willing to take for a given application of the electrical system 100. The model update results are provided to the user (e.g., via the user interface 106) in terms of life consumed for each IGBT that can help define maintenance intervals. The model 180 also allows scheduled maintenance, component replacement, etc. to be done in adaptive intelligent usage and risk based manner as opposed to fixed replacement intervals. This provides a unique IGBT predictive reliability model that takes into account the severity of downtime for their processes.

Figure 6:
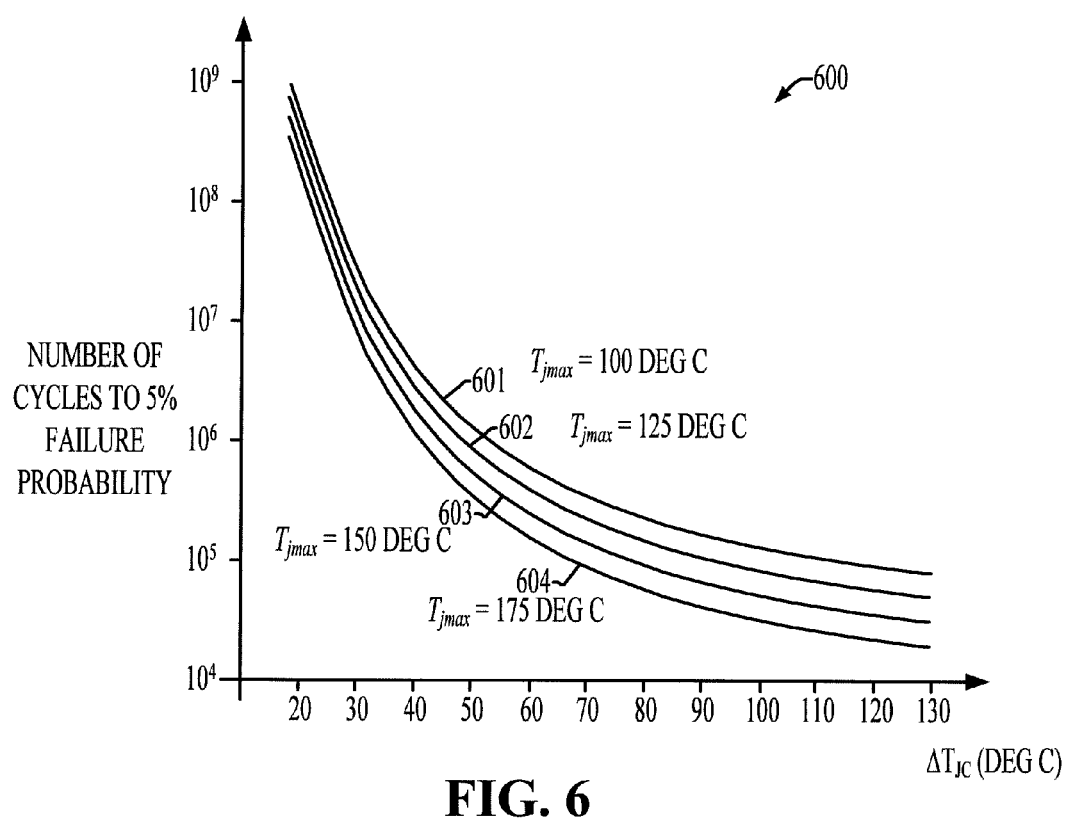
FIG. 6 is a graph.

Turning now to FIGS. 4-6, FIGS. 4 and 5 show example sets of prognostic data 182 with respect to an example IGBT switch S1 in the motor drive 100. The example of FIG. 4 shows the cumulative state of the IGBT S1 with respect to thermal cycle stress at a first example time, and the example of FIG. 5 shows the degradation state of the IGBT S1 at a later time during operation of the motor drive 100. The inventors have appreciated that IGBT reliability for a given time (or cycles) can be expressed using a two parameter Weibull distribution according the following equation (1):

$$R(t) = e^{-(t/\eta)^\beta} \quad (1)$$

where β is a shape parameter, and η is the characteristic life of an IGBT. Rearranging equation (1) yields the following equation (2) to express the relationship between the percentage X % of a population of this type of IGBT component that may fail before a given number of thermal stress cycles (N):

$$N = \eta \cdot [\ln(1-X)]^{(1/\beta)} \quad (2)$$

In this case, the value "X" is the user defined risk factor 400 in FIGS. 4 and 5. In one example, if a user is willing to take a 5% chance that IGBTs may fail before expected, then the user can set the Risk parameter 400 to X=0.05. The physics of failure models for IGBTs reliability is based on the Coffin-Mason model, junction-case temperature, and can be expressed in terms of the characteristics life η according to the following equation (3):

$$\eta(\Delta T_{jc}) = \frac{m}{\Delta T_{jc}^n}, \quad (3)$$

where $\Delta T_{jc}$ is the IGBT junction-case temperature change value in degrees C., and m and n are constants depending on the specific IGBT electrical component. Equation (4) below provides a universal model for characteristic life has been developed for example IGBT power cycling data:

$$\eta(\Delta T_{jc}) = \frac{10^A}{10^{B \cdot \exp(-C \cdot \Delta T^D)}} \quad (4)$$

where $$A = A_1 \cdot T_{j,max} + A_0 \quad (5)$$

$$B = B_1 \cdot T_{j,max} + B_0 \quad (6)$$

$$C = C_1 \cdot T_{j,max} + C_0 \quad (7)$$

$$D = D_1 \cdot T_{j,max} + D_0 \quad (8)$$

The following equation (9) describes an IGBT reliability model by combining equations (4) and (2):

$$N = \frac{10^A}{10^{B \cdot \exp(-C \cdot \Delta T_{jc}^D)}} \cdot -[\ln(1-X)]^{(1/\beta)} \quad (9)$$

For IGBTs, the cumulative damage or degradation value D can be computed using Miner's Rule according to the following equation (10):

$$D = \sum_{i=0}^{m} \frac{n_i}{N_i} \quad (10)$$

where N is the maximum number of cycles define by equation (9) for a given risk factor (X) and temperature change value (ΔT), and n is the actual number of cycles. The examples of FIGS. 4 and 5 show prognostic values 182 for an implementation using a maximum junction temperature ($T_{jmax}$) of 150° C., A (equation (5) above)=10.5676, B (equation (6) above)=6.384, C (equation (7) above)=74.305 and D (equation (8) above)=−1.379. As previously mentioned, a different maximum junction temperature $T_{jmax}$ can be set by the user according to the operating range parameter 401. In one example, the processor 172 implements the prognostic model program instructions 180 according to user settings from the user interface 106, computes the values 410 for A, B, C and D according to manufacture data, test data and/or a mathematical model, and the processor 172 divides the corresponding operating parameter range into a reasonable number of ranges or bins 420. In the example of FIGS. 4 and 5, 10° C. ranges are provided for the junction-case temperature change value ΔT (indicated as DT in FIGS. 4 and 5) including a minimum temperature 421 and a maximum temperature 422 for each range, and the processor 172 computes and stores the corresponding maximum cycle values N 424 for the corresponding been ranges.

As described above in connection with FIG. 3, the processor 172 maintains cycle count values "n" during the operational usage of the corresponding electrical system component (e.g., IGBT), and in each corresponding stress cycle, increments one of the count values depending on the first value received for the current stress cycle. As shown in FIG. 4, the IGBT S1 has undergone a number of cycles n in each of the different temperature range bins, and each range contributes a corresponding degradation component value 425 "n/N". To determine the cumulative degradation value 426, the processor 172 adds the individual degradation component values 425. In the example of FIG. 4, the IGBT has undergone 79% cumulative degradation based on the junction-case temperature cycle stress. In this example, the warning an alarm threshold levels 402 and 403 have been not been exceeded by the IGBT, and accordingly the processor 172 does not provide any warning or alarm 184 to the user. After further operation of the IGBT, as shown in FIG.

5, the cumulative degradation value 426 has reached 83%, and in each given stress cycle, the processor 172 provides a warning 184 based on the degradation exceeding the warning level threshold 402. The user may schedule preventative maintenance to replace the IGBT based on the warning, or may wait until an alarm level is reached (e.g., 95% in this example). Any remedial action can be taken automatically in certain examples, for instance, the processor 172 can perform a controlled shutdown of the motor drive system 100 based on the degradation value 426 reaching the alarm level 403. In certain examples, the processor 172 operates to update the counter values 423 in substantially real time, for example, periodically at every given stress cycle, and the degradation calculations can, but need not, be updated as frequently. For instance, the counter values 423 can be updated in substantially real time, while the prognostic assessment via the computation of the values 425 and 426 can be performed daily or weekly or at some other significantly longer interval.

FIG. 6 shows an example reliability graph 600 including curves 601, 602, 603 and 604 showing the expected number of cycles to 5% failure probability as a function of the junction case temperature change value $\Delta T_{JC}$ for four example Max junction temperature values 100° C., 125° C., 150° C. and 175° C., respectively. As previously discussed, the curves 601-604 represent the modeling which is incorporated into the values N 424 representing the maximum number of stress cycles the IGBT can undergo within the corresponding temperature change value range before the predefined risk factor level of degradation is reached. The curves 601-604, moreover, can be representative of manufacturer data for a given electrical component, empirical testing of a given type of electrical component and/or typing of an otherwise developed mathematical model for the given electrical component.

A user may also desire to plan maintenance of one or more system components. The processor 172 in certain examples is programmed to predict when a fan or other component will reach the alarm state or other predetermined remaining life value. The processor 172 in one example uses a rate of damage per hour ($\Delta CD$) derived from customer usage as a basis to predict a remaining time $t_r$. In one implementation, the processor 172 is programmed to implement a simple infinite-impulse-response (IRR) low-pass filter to calculate a pseudo rolling average rate of degradation $\Delta CD$ according to the following equation (11) using the cumulative degradation value CD (referred to above as "D"):

$$\Delta CD_i = \Delta CD_{i-1} + \frac{UC0}{UC1 + UC0} \cdot [(CD_i - CD_{i-1}) - \Delta CD_{i-1}] \quad (11)$$

where UC0 is the update time (e.g., every 1 hour) and UC1 is the time constant of the cumulative degradation rate calculation (e.g., 96 hours or 4 days). The processor in one example computes a predicted remaining time ($t_r$) when the fan or other component needs to be replaced (e.g., when a user-specified event level L1 will be reached) using the current component cumulative degradation value (CD) and a filtered use case cumulative degradation accumulation rate ($\Delta CD$) from Eq. (11), according to the following equation (12):

$$t_r = \frac{(L1 - CD)}{\Delta CD} \quad (12)$$

where the units for replacement time $t_r$ are based on the use case definition (e.g., hours).

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense. In accordance with further aspects of the present disclosure, a non-transitory computer readable medium is provided, such as a computer memory, a memory within a power converter control system (e.g., controller memory 174, a CD-ROM, floppy disk, flash drive, database, server, computer, etc.), which includes computer executable instructions for performing the above-described methods. The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A method for estimating degradation of an electrical system component caused by an operating parameter that stresses the electrical system component for each of series of stress cycles, the method comprising:

maintaining by an apparatus a plurality of cycle count values, each individual cycle count value corresponding to one of a plurality of non-overlapping ranges of values of the operating parameter;

storing by the apparatus a plurality of maximum cycle values, each individual maximum cycle value corresponding to one of the plurality of non-overlapping ranges of values of the operating parameter, each individual maximum cycle value representing a number of stress cycles in the corresponding range of values of the operating parameter at which the electrical system component is expected to have a user defined failure probability value;

for a given stress cycle, receiving by the apparatus from the electrical system a first value representing the operating parameter for the given stress cycle;

for the given stress cycle, incrementing by the apparatus one of the cycle count values that corresponds to the range of values of the operating parameter that includes the first value;

for the given stress cycle, computing by the apparatus a cumulative degradation value for the electrical system component as a sum of a plurality of ratios of the individual cycle count values divided by the corresponding maximum cycle values of the plurality of values of the operating parameter;

computing by the apparatus a predicted remaining time when the electrical system component needs to be replaced using the cumulative degradation value and a filtered use case cumulative degradation accumulation rate; and selectively generating by the apparatus a first message on an interface of the electrical system, the first message comprising at least a warning generated when the cumulative degradation value for the given stress cycle exceeds a user defined first threshold value.

2. The method of claim 1, further comprising:
selectively generating a second message on the interface of the electrical system, the second message comprising at least an alarm generated when the cumulative degradation value for the given stress cycle exceeds a user defined second threshold value, the second threshold value being greater than the first threshold value.

3. The method of claim 1, wherein the electrical system component is a motor drive component.

4. The method of claim 3, wherein the motor drive component is an insulated gate bipolar transistor (IGBT), and wherein the operating parameter is a junction temperature change.

5. The method of claim 3, wherein the motor drive component is a capacitor, and wherein the operating parameter is one of a temperature and a voltage.

6. The method of claim 3, wherein the motor drive component is a fan, and wherein the operating parameter is a fan speed and ambient temperature.

7. The method of claim 3, wherein the method is implemented in a processor of a motor drive.

8. A non-transitory computer readable medium with computer executable instructions for estimating degradation of an electrical system component caused by an operating parameter that stresses the electrical system component for each of series of stress cycles, the computer readable medium comprising computer-executable instructions which, when executed by a processor, cause the processor to:
maintain a plurality of cycle count values, each individual cycle count value corresponding to one of a plurality of non-overlapping ranges of values of the operating parameter;
store a plurality of maximum cycle values, each individual maximum cycle value corresponding to one of the plurality of non-overlapping ranges of values of the operating parameter, each individual maximum cycle value representing a number of stress cycles in the corresponding range of values of the operating parameter at which the electrical system component is expected to have a user defined failure probability value;
for a given stress cycle, receive a first value representing the operating parameter for the given stress cycle from the electrical system;
for the given stress cycle, increment one of the cycle count values that corresponds to the range of values of the operating parameter that includes the first value;
for the given stress cycle, compute a cumulative degradation value for the electrical system component as a sum of a plurality of ratios of the individual cycle count values divided by the corresponding maximum cycle values of the plurality of values of the operating parameter;

compute a predicted remaining time when the electrical system component needs to be replaced using the cumulative degradation value and a filtered use case cumulative degradation accumulation rate; and selectively generate a first message on an interface of the electrical system, the first message comprising at least a warning generated when the cumulative degradation value for the given stress cycle exceeds a user defined first threshold value.

9. The non-transitory computer readable medium of claim 8, further comprising computer-executable instructions which, when executed by the processor, cause the processor to:
selectively generate a second message on the interface of the electrical system, the second message comprising at least an alarm generated when the cumulative degradation value for the given stress cycle exceeds a user defined second threshold value, the second threshold value being greater than the first threshold value.

10. The non-transitory computer readable medium of claim 8, wherein the electrical system component is a motor drive component.

11. The non-transitory computer readable medium of claim 10, wherein the motor drive component is an insulated gate bipolar transistor (IGBT), and wherein the operating parameter is a junction temperature change.

12. The non-transitory computer readable medium of claim 10, wherein the motor drive component is a capacitor, and wherein the operating parameter is one of a temperature and a voltage.

13. The non-transitory computer readable medium of claim 10, wherein the motor drive component is a fan, and wherein the operating parameter is a fan speed and ambient temperature.

14. A system for estimating degradation of an electrical system component caused by an operating parameter that stresses the electrical system component for each of series of stress cycles, the system comprising:
an electronic memory that stores:
a plurality of cycle count values, each individual cycle count value corresponding to one of a plurality of non-overlapping ranges of values of the operating parameter, and
a plurality of maximum cycle values, each individual maximum cycle value corresponding to one of the plurality of non-overlapping ranges of values of the operating parameter, each individual maximum cycle value representing a number of stress cycles in the corresponding range of values of the operating parameter at which the electrical system component is expected to have a user defined failure probability value; and
a processor programmed to:
for a given stress cycle, receive a first value representing the operating parameter for the given stress cycle from the electrical system,
for the given stress cycle, increment one of the cycle count values that corresponds to the range of values of the operating parameter that includes the first value,
for the given stress cycle, compute a cumulative degradation value for the electrical system component as a sum of a plurality of ratios of the individual cycle count values divided by the corresponding maximum cycle values of the plurality of values of the operating parameter;

compute a predicted remaining time when the electrical system component needs to be replaced using the cumulative degradation value and a filtered use case cumulative degradation accumulation rate; and selectively generate a first message on an interface of the electrical system, the first message comprising at least a warning generated when the cumulative degradation value for the given stress cycle exceeds a user defined first threshold value.

15. The system of claim 14, wherein the processor is further programmed to:

selectively generate a second message on the interface of the electrical system, the second message comprising at least an alarm generated when the cumulative degradation value for the given stress cycle exceeds a user defined second threshold value, the second threshold value being greater than the first threshold value.

16. The system of claim 14, wherein the electrical system component is a motor drive component.

17. The system of claim 16, wherein the motor drive component is an insulated gate bipolar transistor (IGBT), and wherein the operating parameter is a junction temperature change.

18. The system of claim 16, wherein the motor drive component is a capacitor, and wherein the operating parameter is one of a temperature and a voltage.

19. The system of claim 16, wherein the motor drive component is a fan, and wherein the operating parameter is a fan speed and a temperature.

20. The system of claim 14, wherein the electronic memory and the processor are implemented in a motor drive.

* * * * *